US010050653B2

(12) United States Patent
Pehlivanoglu

(10) Patent No.: US 10,050,653 B2
(45) Date of Patent: Aug. 14, 2018

(54) CIRCUITS AND METHODS RELATED TO SWITCHLESS CARRIER AGGREGATION IN RADIO-FREQUENCY RECEIVERS

(71) Applicant: SKYWORKS SOLUTIONS, INC., Woburn, MA (US)

(72) Inventor: Ibrahim Engin Pehlivanoglu, Costa Mesa, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 468 days.

(21) Appl. No.: 14/683,532

(22) Filed: Apr. 10, 2015

(65) Prior Publication Data

US 2015/0296515 A1    Oct. 15, 2015

Related U.S. Application Data

(60) Provisional application No. 61/978,810, filed on Apr. 11, 2014.

(51) Int. Cl.
*H04B 1/12* (2006.01)
*H04B 1/00* (2006.01)
*H03F 3/191* (2006.01)
*H04L 5/00* (2006.01)
*H04L 5/14* (2006.01)

(52) U.S. Cl.
CPC ............ *H04B 1/123* (2013.01); *H03F 3/191* (2013.01); *H04B 1/0057* (2013.01); *H04L 5/001* (2013.01); *H04L 5/14* (2013.01); *H03F 2200/111* (2013.01); *H03F 2200/294* (2013.01); *H04L 5/0023* (2013.01)

(58) Field of Classification Search
None
See application file for complete search history.

(56) References Cited

U.S. PATENT DOCUMENTS

| | | | | |
|---|---|---|---|---|
| 5,966,646 A | * | 10/1999 | Lampe | H03D 7/163 |
| | | | | 375/347 |
| 2001/0029172 A1 | * | 10/2001 | Lee | H03F 1/56 |
| | | | | 455/234.1 |
| 2002/0034934 A1 | * | 3/2002 | Watanabe | H01P 1/15 |
| | | | | 455/318 |

(Continued)

FOREIGN PATENT DOCUMENTS

GB    2486916 A    7/2012

*Primary Examiner* — James P Duffy
(74) *Attorney, Agent, or Firm* — Chang & Hale LLP

(57) ABSTRACT

Circuits and methods related to switchless carrier aggregation in radio-frequency receivers. In some embodiments, a carrier aggregation (CA) circuit can include a first filter configured to allow operation in a first frequency band, and a second filter configured to allow operation in a second frequency band. The CA circuit can further include a first signal path implemented between the first filter and an output node, with the first signal path including a plurality of amplification stages configured to amplify a first radio-frequency (RF) signal. The first signal path can be substantially free of switches. The CA circuit can further include a second signal path implemented between the second filter and the output node, with the second signal path including a plurality of amplification stages configured to amplify a second RF signal. The second signal path can be substantially free of switches.

14 Claims, 12 Drawing Sheets

(56) References Cited

U.S. PATENT DOCUMENTS

| | | |
|---|---|---|
| 2004/0232993 A1 | 11/2004 | Yeh |
| 2010/0240302 A1* | 9/2010 | Buczkiewicz .......... H04B 1/034 455/11.1 |
| 2012/0302282 A1* | 11/2012 | Pascolini ................. H03H 7/38 455/550.1 |
| 2013/0315348 A1 | 11/2013 | Tasic et al. |
| 2014/0169243 A1* | 6/2014 | Khlat ................... H04B 7/0602 370/297 |

* cited by examiner

CIRCUITS AND METHODS RELATED TO SWITCHLESS CARRIER AGGREGATION IN RADIO-FREQUENCY RECEIVERS

CROSS-REFERENCE TO RELATED APPLICATION(S)

This application claims priority to U.S. Provisional Application No. 61/978,810 filed Apr. 11, 2014, entitled CIRCUITS AND METHODS RELATED TO SWITCHLESS CARRIER AGGREGATION IN RADIO-FREQUENCY RECEIVERS, the disclosure of which is hereby expressly incorporated by reference herein in its entirety.

BACKGROUND

Field

The present disclosure relates to carrier aggregation in radio-frequency (RF) receivers.

Description of the Related Art

In some RF applications, cellular carrier aggregation (CA) can involve two or more RF signals being processed through a common path. For example, carrier aggregation can involve use of a path for a plurality of bands having frequency ranges that are sufficiently separated. In such a configuration, simultaneous operation of more than one band can be achieved.

SUMMARY

In a number of implementations, the present disclosure relates to a carrier aggregation (CA) circuit that includes a first filter configured to allow operation in a first frequency band, and a second filter configured to allow operation in a second frequency band. The CA circuit further includes a first signal path implemented between the first filter and an output node. The first signal path includes a plurality of amplification stages configured to amplify a first radio-frequency (RF) signal. The first signal path is substantially free of switches. The CA circuit further includes a second signal path implemented between the second filter and the output node. The second signal path includes a plurality of amplification stages configured to amplify a second RF signal. The second signal path is substantially free of switches.

In some embodiments, the first signal path and the second signal path can be parts of a low-noise amplifier (LNA). The first signal path and the second signal path being substantially free of switches can allow the CA circuit to operate with a reduced noise figure.

In some embodiments, the plurality of amplification stages of each of the first signal path and the second signal path can include a first stage and a second stage. The first stage can be configured to convert the respective RF signal into current. The second stage can be configured to add the current.

In some embodiments, the first stage of each of the first signal path and the second signal path can include a first bipolar junction transistor (BJT) configured to receive the respective RF signal through its base and yield an output through its collector. The CA circuit can further include a bias circuit coupled to the first BJT. The bias circuit can include a switchable bias supply path between a bias node and the base, with the switchable bias supply path configured to be capable of being turned on or off to activate or deactivate the respective first BJT. The bias circuit can further include a switchable shunt path configured to provide a shunt path when the respective first BJT is deactivated.

In some embodiments, the first BJT of each of the first signal path and the second signal path can include an emitter coupled to ground through an inductance. The emitters of the first BJT of the first signal path and the second signal path can be coupled to ground through separate inductances, or through a common inductance.

In some embodiments, the second stages of the first signal path and the second signal path can be provided by a shared second BJT configured to receive the RF signals from the first BJTs through its emitter and yield an output through its collector. The shared second BJT can be configured to receive a cascode bias voltage Vcas through its base. The cascode bias voltage Vcas can be adjustable depending on the number of inputs into the shared second BJT.

In some embodiments, the second stage of each of the first signal path and the second signal path can include a separate second BJT configured to receive the RF signal from the respective first BJT through its emitter and yield an output through its collector. Each separate second BJT can be configured to receive its respective cascode bias voltage Vcas through its base.

In some embodiments, the first filter and the second filter can be parts of a diplexer. The diplexer can include an input port configured to receive an RF signal from an antenna.

In some embodiments, each of the first signal path and the second signal path can be capable of being in an active state or an inactive state to allow the CA circuit to operate in a CA mode or a non-CA mode without separate switches along the first signal path and the second signal path. The active state or the inactive state for each of the first signal path and the second signal path can be achieved by activating or deactivating the respective first stage.

According to some implementations, the present disclosure relates to a radio-frequency (RF) module that includes a packaging substrate configured to receive a plurality of components, and a carrier aggregation (CA) circuit implemented on the packaging substrate. The CA circuit includes a first filter configured to allow operation in a first frequency band and a second filter configured to allow operation in a second frequency band. The CA circuit further includes a first signal path implemented between the first filter and an output node, with the first signal path including a plurality of amplification stages configured to amplify a first radio-frequency (RF) signal, and the first signal path being substantially free of switches. The CA circuit further includes a second signal path implemented between the second filter and the output node, with the second signal path including a plurality of amplification stages configured to amplify a second RF signal, and the second signal path being substantially free of switches.

In some embodiments, each of the first filter and the second filter can include a surface acoustic wave (SAW) filter. The first SAW filter and the second SAW filter can be implemented as a diplexer. The plurality of amplification stages for each of the first signal path and the second signal path can be part of a low-noise amplifier (LNA).

In some embodiments, the RF module can be a front-end module. In some embodiments, the RF module can be a diversity receive (DRx) module.

In some teachings, the present disclosure relates to a method for fabricating a radio-frequency (RF) module. The method includes providing or forming a packaging substrate configured to receive a plurality of components, and implementing a carrier aggregation (CA) circuit on the packaging substrate. The CA circuit includes a first filter configured to allow operation in a first frequency band and a second filter configured to allow operation in a second frequency band. The CA circuit further includes a first signal path implemented between the first filter and an output node, with the first signal path including a plurality of amplification stages configured to amplify a first radio-frequency (RF) signal, and the first signal path being substantially free of switches. The CA circuit further includes a second signal path implemented between the second filter and the output node, with the second signal path including a plurality of amplification stages configured to amplify a second RF signal, and the second signal path being substantially free of switches.

In accordance with a number of implementations, the present disclosure relates to a radio-frequency (RF) device that includes a receiver configured to process RF signals, and an RF module in communication with the receiver. The RF module includes a carrier aggregation (CA) circuit having a first filter configured to allow operation in a first frequency band and a second filter configured to allow operation in a second frequency band. The CA circuit further includes a first signal path implemented between the first filter and an output node, with the first signal path including a plurality of amplification stages configured to amplify a first radio-frequency (RF) signal, and the first signal path being substantially free of switches. The CA circuit further includes a second signal path implemented between the second filter and the output node, with the second signal path including a plurality of amplification stages configured to amplify a second RF signal, and the second signal path being substantially free of switches. The RF device further includes an antenna in communication with the RF module, with the antenna being configured to receive the RF signals.

In some embodiments, the RF device can be a wireless device. Such a wireless device can be, for example, a cellular phone. In some embodiments, the antenna can include a diversity antenna, and the RF module can include a diversity receive (DRx) module). In some embodiments, the wireless device can further include an antenna switch module (ASM) configured to route the RF signals from the diversity antenna to the receiver. The DRx module can be implemented between the diversity antenna and the ASM.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Cellular carrier aggregation (CA) can allow two or more radio-frequency (RF) signals to be processed through a common path. For example, carrier aggregation can involve use of a path for a plurality of bands having frequency ranges that are sufficiently separated. In such a configuration, simultaneous operation of more than one band is possible.

In the context of a receiver, carrier aggregation can allow concurrent processing of RF signals in a plurality of bands to provide, for example, high data rate capability. In such a carrier aggregation system, it is desirable to maintain a low noise figure (NF) for each RF signal. When two bands being aggregated are close in frequency, maintaining sufficient separation of the two bands is also desirable.

Figure 1:
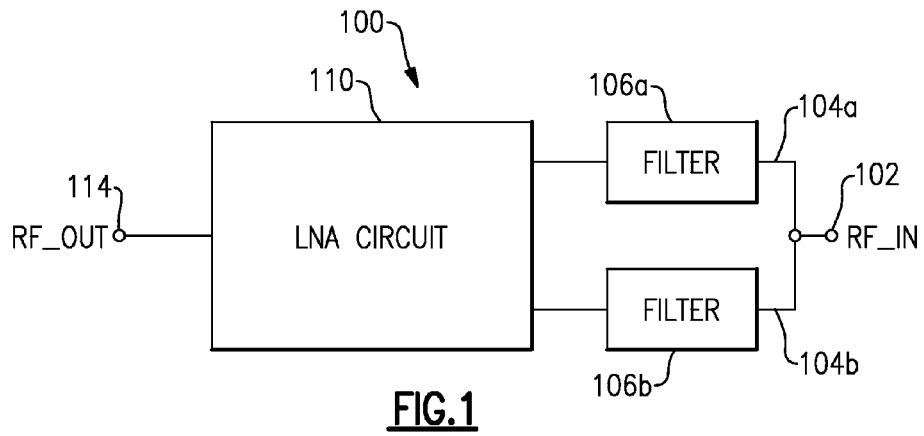
FIG. 1 shows a carrier aggregation (CA) configuration that includes a low-noise amplifier (LNA) circuit configured to receive two inputs and yield an output.

FIG. 1 shows a carrier aggregation (CA) configuration 100 that includes a low-noise amplifier (LNA) circuit 110 configured to receive two inputs and yield an output. The two inputs can include a first RF signal and a second RF signal. The first RF signal can be provided to the LNA circuit 110 from a common input node 102 (RF_IN), through a first path 104a that includes a first filter 106a. Similarly, the second RF signal can be provided to the LNA circuit 110 from the common input node 102 (RF_IN), through a second path 104b that includes a second filter 106b. As described herein, the LNA circuit 110 can be configured such that the output at a common output node 114 is an amplified RF signal that includes two separated frequency bands associated with the first and second RF signals. As also described herein, the LNA circuit 110 can be configured to yield desirable performance features such as low loss, low noise figure, and high isolation between the two signal paths 104a, 104b.

Figure 2:
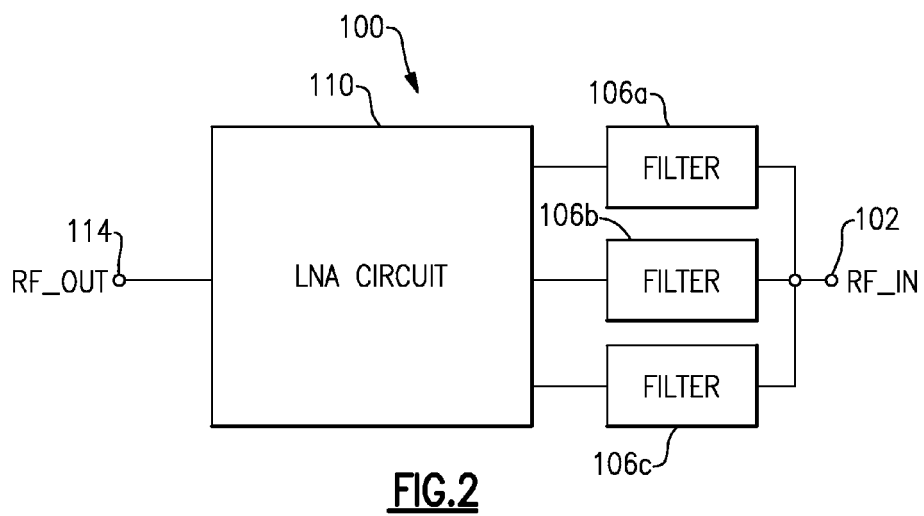
FIG. 2 shows that one or more features of the present disclosure can also be implemented in aggregation of more than two frequency bands.

Various examples herein, including the example of FIG. 1, are described in the context of aggregating two frequency bands. However, it will be understood that one or more features of the present disclosure can be implemented in aggregation of more than two frequency bands. For example, FIG. 2 shows a CA configuration 100 where three RF signals are separated at a common input node 102 (RF_IN), processed through their respective filters 106a, 106b, 106c, and processed by an LNA circuit 110 to yield an amplified RF signal at a common output node 114 (RF_OUT). It will be understood that other numbers of frequency bands can also be aggregated utilizing one or more features as described herein.

Figure 3:
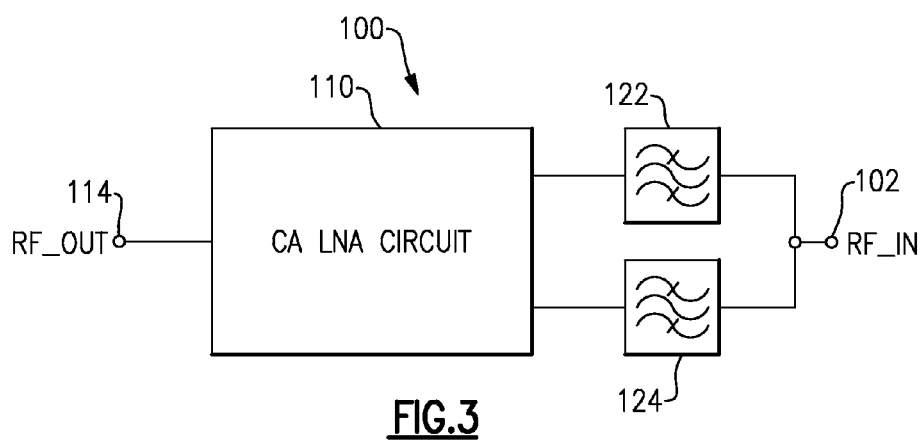
FIG. 3 shows an example where an LNA circuit having one or more features as described herein can be implemented to provide CA functionalities without switches along the signal paths.

The aggregation configurations 100 of FIGS. 1 and 2 can be implemented in a number of RF applications. FIG. 3 shows a more specific example where an LNA circuit 110 having one or more features as described herein can be implemented to provide CA functionalities without switches, or with reduced number of switches, along the signal paths. The LNA circuit 110 can be configured to receive, for example, two inputs and yield an output. The two inputs can include a first RF signal and a second RF signal. The first RF signal can be provided to the LNA circuit 110 from a common input node 102 (RF_IN), through a first path that includes a first band-pass filter 122. Similarly, the second RF signal can be provided to the LNA circuit 110 from the common input node 102 (RF_IN), through a second path that includes a second band-pass filter 124. As described herein, the LNA circuit 110 can be configured such that the output at a common output node 114 is an amplified RF signal that includes two separated frequency bands associated with the first and second RF signals. As also described herein, the LNA circuit 110 can be configured to yield desirable performance features such as low loss, low noise figure, and high isolation between the two input signal paths.

In some embodiments, the LNA circuit 110 can be configured to operate with a sufficiently wide bandwidth to effectively amplify the first and second bands. In some embodiments, the pass-band filters 122, 124 can be implemented in a number of ways, including, for example, as surface acoustic wave (SAW) filters. Although various examples are described herein in the context of SAW filters, it will be understood that other types of filters can also be utilized.

Figure 4:
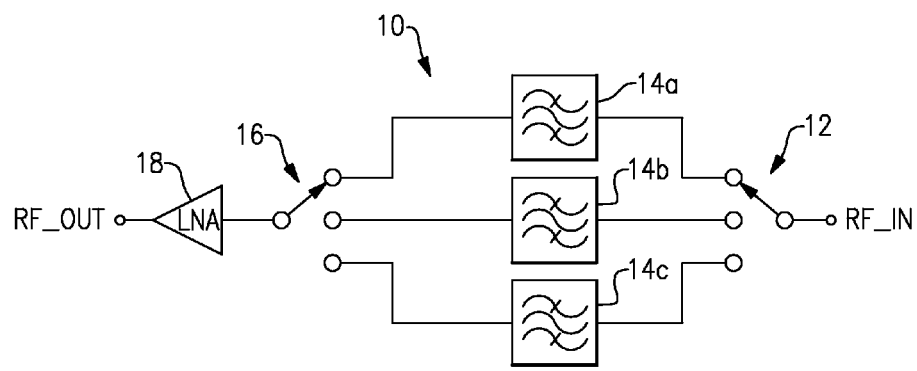
FIG. 4 shows an example of a multiband receiver architecture configured to operate in three frequency bands utilizing a common antenna and a common LNA.

As described herein, the aggregation configuration 100 of FIG. 3 can provide a number of advantageous features over other receiver configurations. For example, FIG. 4 shows a multiband receiver architecture 10 configured to operate in three frequency bands utilizing a common antenna (not shown) and a common LNA 18. An RF signal from the common antenna is shown to be received as an input signal RF_IN; and such an input signal can be routed through one of the three paths by a first switch 12 and a second switch 16. For example, the first and second switches 12, 16 in the states as shown allow the input signal to be routed to a first band-pass filter 14a to yield a first filtered signal corresponding to the first frequency band. If operation in the second frequency band is desired, the first and second switches 12, 16 can be set so as to route the input signal to a second band-pass filter 14b to yield a second filtered signal corresponding to the second frequency band. Similarly, if operation in the third frequency band is desired, the first and second switches 12, 16 can be set so as to route the input signal to a third band-pass filter 14c to yield a third filtered signal corresponding to the third frequency band.

In the example of FIG. 4, operation in CA mode is generally not possible, since turning on two paths at the same time results in the two filter outputs to be shorted. Further, the switches in the architecture 10 can yield performance and/or design challenges. For example, the second switch 16 can result in degradation of, for example, noise figure performance. In another example, the switches and the LNA may need to be of different processes (e.g., silicon-on-insulator (SOI) for the switches and bipolar junction transistor (BJT) for the LNA) for desired performance; and use of such different processes can result in significant increases in device size and/or cost.

Figure 5:
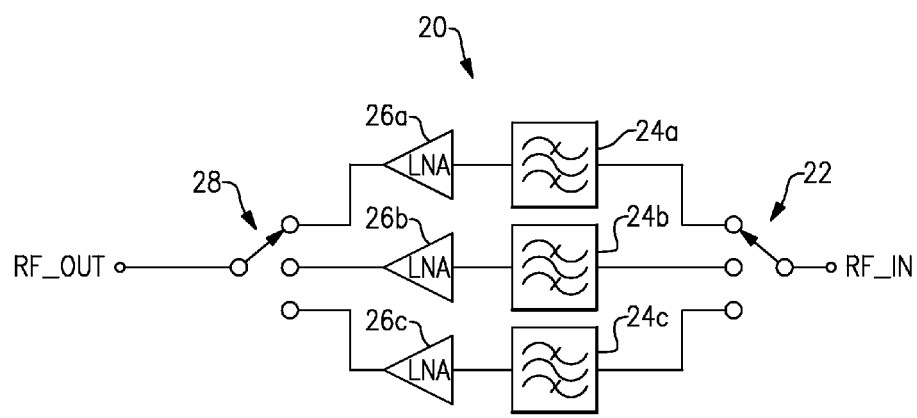
FIG. 5 shows another example of a multiband receiver architecture configured to operate in three frequency bands utilizing a common antenna and three separate LNAs.

FIG. 5 shows another example of a multiband receiver architecture 20 configured to operate in three frequency bands utilizing a common antenna (not shown) and three separate LNAs 26a, 26b, 26c. An RF signal from the common antenna is shown to be received as an input signal RF_IN; and such an input signal can be routed through one of the three paths by a first switch 22 and a second switch 28. For example, the first and second switches 22, 28 in the states as shown allow the input signal to be routed to a first band-pass filter 24a to yield a first filtered signal corresponding to the first frequency band; and such a filtered signal is shown to be provided to the first LNA 26a. If operation in the second frequency band is desired, the first and second switches 22, 28 can be set so as to route the input signal to a second band-pass filter 24b to yield a second filtered signal corresponding to the second frequency band; and such a filtered signal is shown to be provided to the second LNA 26b. Similarly, if operation in the third frequency band is desired, the first and second switches 22, 28 can be set so as to route the input signal to a third band-pass filter 24c to yield a third filtered signal corresponding to the third frequency band; and such a filtered signal is shown to be provided to the third LNA 26c.

In the example of FIG. 5, the second switch 28 being implemented after the LNAs can solve, to a large degree, the noise figure degradation problem associated with the example of FIG. 4, since the noise associated with the second switch is not amplified. However, the architecture 20 of FIG. 5 typically requires a separate LNA for each filter of the multiple signal paths. Such multiple LNAs typically result in increased size, cost, and/or complexity associated with the receiver architecture. Further, operation in CA mode is typically not possible since enabling two paths at the same time results in LNA outputs to be shorted.

Figure 6:
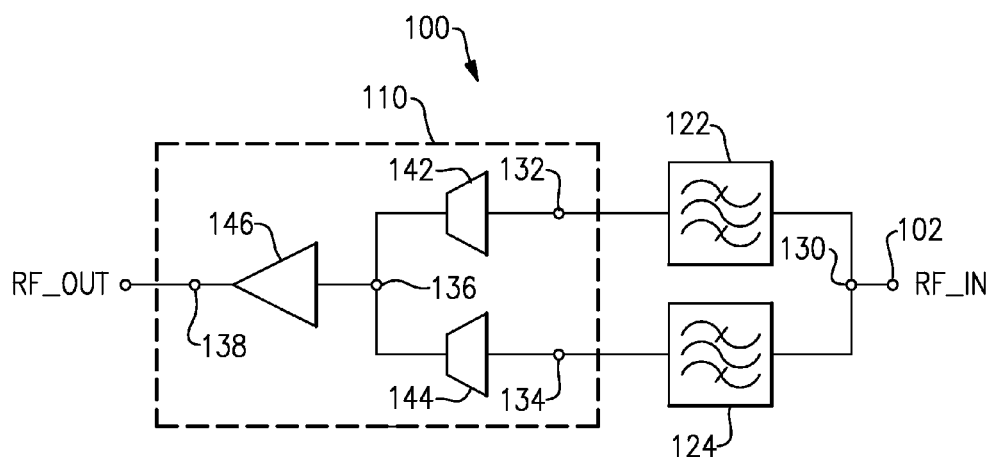
FIG. 6 shows a carrier aggregation (CA) architecture that includes an LNA circuit configured such that switches between band-pass filters and LNA(s) can be eliminated, and yet allow the CA architecture to operate in a CA mode or a non-CA mode.

FIG. 6 shows a carrier aggregation (CA) architecture 100 that includes an LNA circuit 110 configured such that switches between band-pass filters and LNA(s) can be eliminated, and yet allow the CA architecture 100 to operate in a CA mode or a non-CA mode. The LNA circuit 110 can be configured to receive a plurality of inputs (e.g., two inputs) and yield an output. The two inputs can include a first RF signal and a second RF signal separated at a common node 130. The first RF signal can be provided to the LNA circuit 110 from a common input node 102 (RF_IN), through a first path that includes a first band-pass filter 122. Similarly, the second RF signal can be provided to the LNA circuit 110 from the common input node 102 (RF_IN), through a second path that includes a second band-pass filter 124.

The LNA circuit 110 can be configured such that the output (RF_OUT) at a common output node 138 is an amplified RF signal that includes two separated frequency bands associated with the first and second RF signals. As described herein, the LNA circuit 110 can be configured to yield desirable performance features such as low loss, low noise figure, and high isolation between the two input signal paths.

In some embodiments, the LNA circuit 110 can include a plurality of amplification paths, with each amplification path being divided into a current converter portion and an adder portion. In the example of FIG. 6, the LNA circuit 110 is shown to include two amplification paths. The first amplification path can include a first input node 132, a first current converter 142, a common node 136, an adder 146, and an output node 138. Similarly, the second amplification path can include a second input node 134, a second current converter 144, the common node 136, the adder 146, and the output node 138. More specific examples of the LNA circuit 110 are described herein in reference to FIGS. 7-9.

In some embodiments, an LNA circuit configured in the foregoing manner can benefit from reduced noise figure due to, for example, absence of a switch between a filter and an amplification circuit in a given path. Additionally, such an absence of switches can reduce the size and/or cost associated with the CA architecture. As described herein, such an LNA circuit can be operated in a CA mode with good isolation between the inputs being aggregated. Further, such an LNA circuit can be easily scalable to accommodate different number of inputs.

Figure 7:
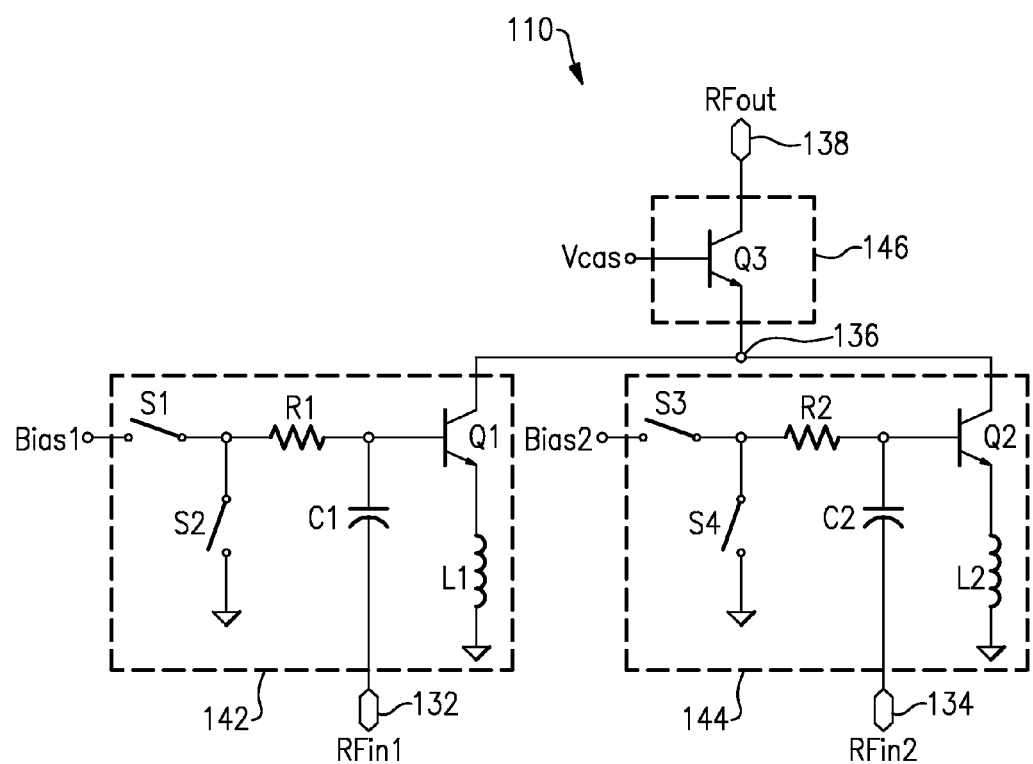
FIG. 7 shows an LNA circuit that can be implemented as a more specific example of the LNA circuit of FIG. 6.

FIG. 7 shows an LNA circuit 110 that can be implemented as a more specific example of the LNA circuit described in reference to FIG. 6. The example of FIG. 7 is a two-input version; however, it will be understood that more than two inputs can be implemented.

In FIG. 7, a first current converter 142 is shown to be configured to receive a first RF signal (RFin1) at a first input node 132, process the first RF signal, and output the processed first RF signal to a common node 136. Similarly, a second current converter 144 is shown to be configured to receive a second RF signal (RFin2) at a second input node 134, process the second RF signal, and output the processed second RF signal to the common node 136. The processed first and second RF signals can be combined at the common node 136 and be further processed by a common adder 146 so as to yield an output RF signal (RFout) at an output node 138.

In FIG. 7, a combination of the first current converter 142 and the common adder 146 can be implemented as a first cascode amplifier. Similarly, a combination of the second current converter 144 and the common adder 146 can be implemented as a second cascode amplifier. Accordingly, each of the first and second current converters (142 or 144) can provide transconductance amplification functionality for its respective RF signal, and the common adder 146 can provide current buffer functionality for the combined RF signal.

In FIG. 7, the first current converter 142 is shown to include a bipolar junction transistor (BJT) Q1 in a common emitter configuration. The first RF signal (RFin1) can be provided from the first input node 132, through a DC block capacitance C1, and to the base of Q1. The output from Q1 can be provided through its collector which is coupled to the common node 136. The emitter of Q1 is shown to be coupled to ground through an inductance L1. A bias signal for Q1 (Bias1) can be provided to the base of Q1 through a bias switch S1 and a base resistance R1. When Q1 is active, the bias switch S1 can be closed, and a shunt switch S2 can be opened. When Q1 is inactive, the bias switch S1 can be opened, and the shunt switch S2 can be closed. Because the bias switch S1 and the shunt switch S2 are not directly along the path of the first RF signal (RFin1), they contribute little or no noise to the first RF signal.

In FIG. 7, the second current converter 144 is shown to include a BJT Q2 in a common emitter configuration. The second RF signal (RFin2) can be provided from the second input node 134, through a DC block capacitance C2, and to the base of Q2. The output from Q2 can be provided through its collector which is coupled to the common node 136. The emitter of Q2 is shown to be coupled to ground through an inductance L2. A bias signal for Q2 (Bias2) can be provided to the base of Q2 through a bias switch S3 and a base resistance R2. When Q2 is active, the bias switch S3 can be closed, and a shunt switch S4 can be opened. When Q2 is inactive, the bias switch S3 can be opened, and the shunt switch S4 can be closed. Because the bias switch S3 and the shunt switch S4 are not directly along the path of the second RF signal (RFin2), they contribute little or no noise to the second RF signal.

In FIG. 7, the common adder 146 is shown to include a BJT Q3 in a common base configuration. The combined RF signal from the common node 136 is shown to be provided to the emitter of Q3, and the output from Q3 is shown to be provided through its collector. The collector is shown to be coupled to the output node 138 so as to yield the output RF signal (RFout). The base of Q3 is shown to be provided with a bias voltage Vcas, which can be adjusted depending on the number of active inputs.

Figure 8:
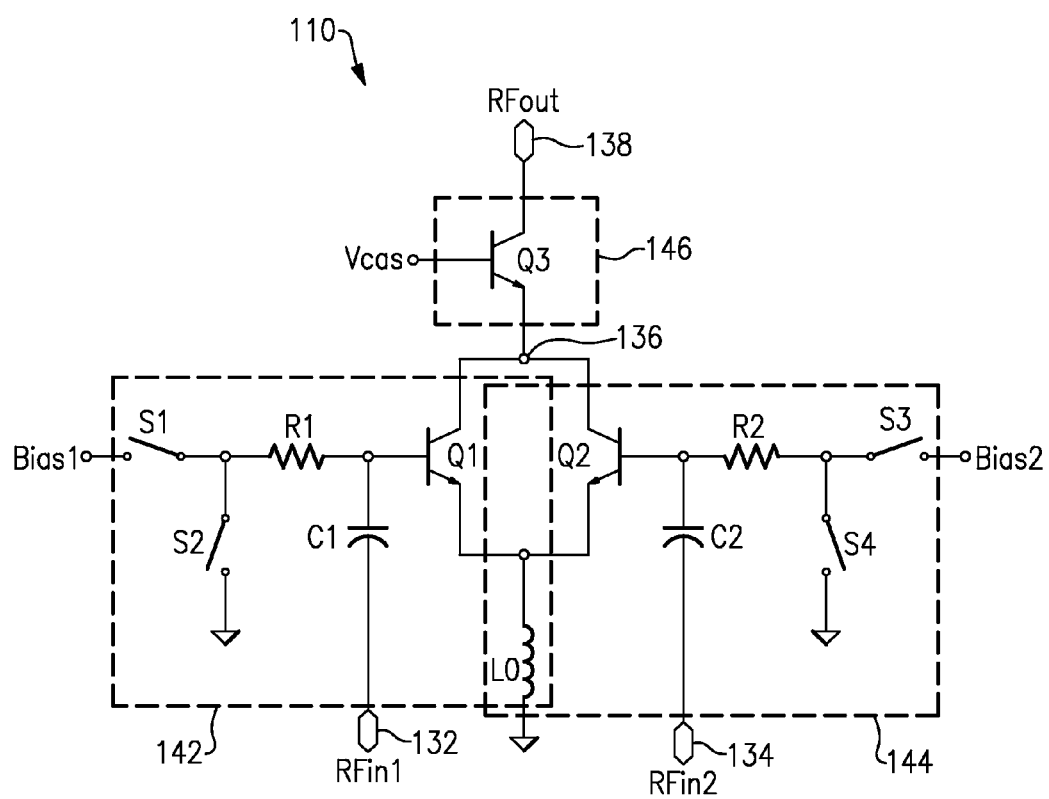
FIG. 8 shows an LNA circuit that can be implemented as another more specific example of the LNA circuit of FIG. 6.

FIG. 8 shows an LNA circuit 110 that can be implemented as another more specific example of the LNA circuit described in reference to FIG. 6. The example of FIG. 8 is a two-input version; however, it will be understood that more than two inputs can be implemented. The example of FIG. 8 is similar to the example of FIG. 7; however, in FIG. 8, the emitters of the BJTs of the first and second current converters share a common inductance.

More particularly, in FIG. 8, a first current converter 142 is shown to be configured to receive a first RF signal (RFin1) at a first input node 132, process the first RF signal, and output the processed first RF signal to a common node 136. Similarly, a second current converter 144 is shown to be configured to receive a second RF signal (RFin2) at a second input node 134, process the second RF signal, and output the processed second RF signal to the common node 136. The processed first and second RF signals can be combined at the common node 136 and be further processed by a common adder 146 so as to yield an output RF signal (RFout) at an output node 138.

In FIG. 8, a combination of the first current converter 142 and the common adder 146 can be implemented as a first cascode amplifier. Similarly, a combination of the second current converter 144 and the common adder 146 can be implemented as a second cascode amplifier. Accordingly, each of the first and second current converters (142 or 144) can provide transconductance amplification functionality for its respective RF signal, and the common adder 146 can provide current buffer functionality for the combined RF signal.

In FIG. 8, the first current converter 142 is shown to include a BJT Q1 in a common emitter configuration. The first RF signal (RFin1) can be provided from the first input node 132, through a DC block capacitance C1, and to the base of Q1. The output from Q1 can be provided through its collector which is coupled to the common node 136. The emitter of Q1 is shown to be coupled to ground through a common inductance L0. A bias signal for Q1 (Bias1) can be provided to the base of Q1 through a bias switch S1 and a base resistance R1. When Q1 is active, the bias switch S1 can be closed, and a shunt switch S2 can be opened. When Q1 is inactive, the bias switch S1 can be opened, and the shunt switch S2 can be closed. Because the bias switch S1 and the shunt switch S2 are not directly along the path of the first RF signal (RFin1), they contribute little or no noise to the first RF signal.

In FIG. 8, the second current converter 144 is shown to include a BJT Q2 in a common emitter configuration. The second RF signal (RFin2) can be provided from the second input node 134, through a DC block capacitance C2, and to the base of Q2. The output from Q2 can be provided through its collector which is coupled to the common node 136. The emitter of Q2 is shown to be coupled to ground through the common inductance L0. A bias signal for Q2 (Bias2) can be provided to the base of Q2 through a bias switch S3 and a base resistance R2. When Q2 is active, the bias switch S3 can be closed, and a shunt switch S4 can be opened. When Q2 is inactive, the bias switch S3 can be opened, and the shunt switch S4 can be closed. Because the bias switch S3 and the shunt switch S4 are not directly along the path of the second RF signal (RFin2), they contribute little or no noise to the second RF signal.

In FIG. 8, the common adder 146 is shown to include a BJT Q3 in a common base configuration. The combined RF signal from the common node 136 is shown to be provided to the emitter of Q3, and the output from Q3 is shown to be provided through its collector. The collector is shown to be coupled to the output node 138 so as to yield the output RF signal (RFout). The base of Q3 is shown to be provided with a bias voltage Vcas, which can be adjusted depending on the number of active inputs.

Figure 9:
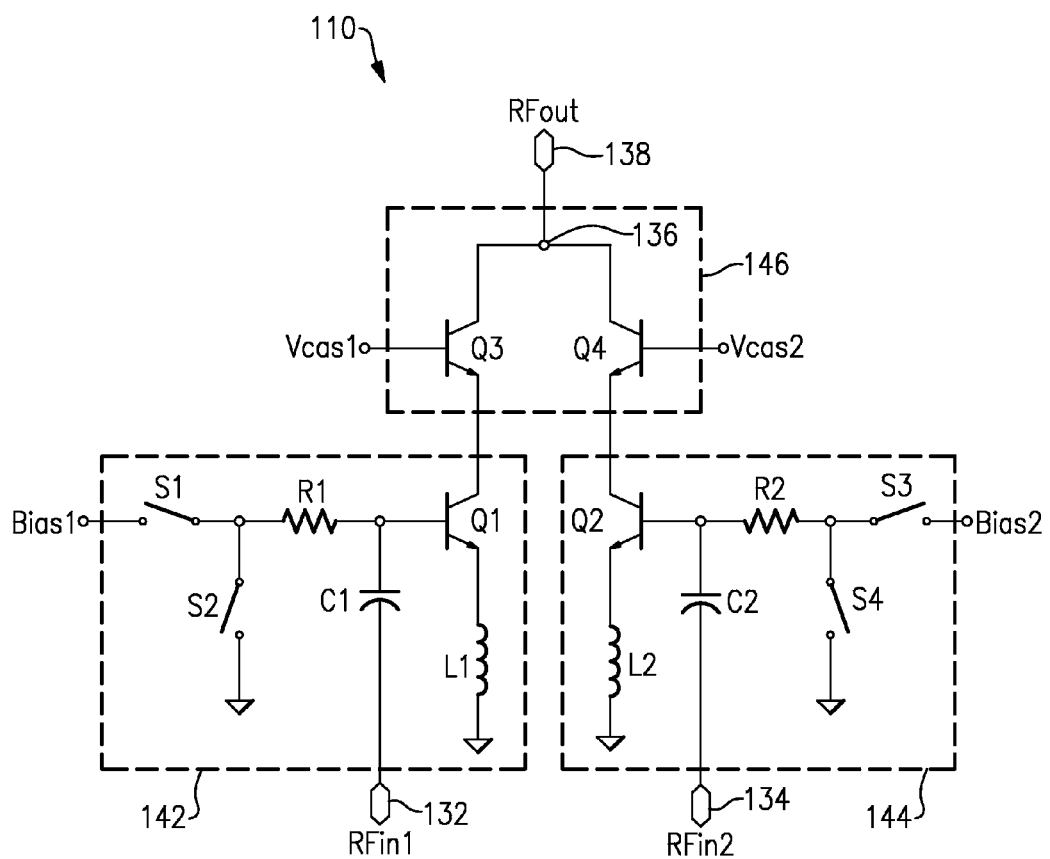
FIG. 9 shows an LNA circuit that can be implemented as yet another more specific example of the LNA circuit of FIG. 6.

FIG. 9 shows an LNA circuit 110 that can be implemented as another more specific example of the LNA circuit described in reference to FIG. 6. The example of FIG. 9 is a two-input version; however, it will be understood that more than two inputs can be implemented. The example of FIG. 9 is similar to the example of FIG. 7; however, in FIG. 9, each of the first and second current converters is coupled to a separate adder.

In FIG. 9, a first current converter 142 is shown to be configured to receive a first RF signal (RFin1) at a first input node 132, process the first RF signal, and output the processed first RF signal to be further processed by an adder circuit 146. Similarly, a second current converter 144 is shown to be configured to receive a second RF signal (RFin2) at a second input node 134, process the second RF signal, and output the processed second RF signal to be further processed by the adder circuit 146. The processed first and second RF signals can be further processed by the adder circuit 146 so as to yield an output RF signal (RFout) at an output node 138.

In FIG. 9, a combination of the first current converter 142 and a portion of the adder circuit 146 can be implemented as a first cascode amplifier. Similarly, a combination of the second current converter 144 and a portion of the adder circuit 146 can be implemented as a second cascode amplifier. Accordingly, each of the first and second current converters (142 or 144) can provide transconductance amplification functionality for its respective RF signal, and their respective portions of the adder circuit 146 can provide current buffer functionality for the respective RF signal.

In FIG. 9, the first current converter 142 is shown to include a BJT Q1 in a common emitter configuration. The first RF signal (RFin1) can be provided from the first input node 132, through a DC block capacitance C1, and to the base of Q1. The output from Q1 can be provided through its collector which is coupled to a corresponding portion of the adder circuit 146. The emitter of Q1 is shown to be coupled to ground through an inductance L1. A bias signal for Q1 (Bias1) can be provided to the base of Q1 through a bias switch S1 and a base resistance R1. When Q1 is active, the bias switch S1 can be closed, and a shunt switch S2 can be opened. When Q1 is inactive, the bias switch S1 can be opened, and the shunt switch S2 can be closed. Because the bias switch S1 and the shunt switch S2 are not directly along the path of the first RF signal (RFin1), they contribute little or no noise to the first RF signal.

In FIG. 9, the second current converter 144 is shown to include a BJT Q2 in a common emitter configuration. The second RF signal (RFin2) can be provided from the second input node 134, through a DC block capacitance C2, and to the base of Q2. The output from Q2 can be provided through its collector which is coupled to a corresponding portion of the adder circuit 146. The emitter of Q2 is shown to be coupled to ground through an inductance L2. A bias signal for Q2 (Bias2) can be provided to the base of Q2 through a bias switch S3 and a base resistance R2. When Q2 is active, the bias switch S3 can be closed, and a shunt switch S4 can be opened. When Q2 is inactive, the bias switch S3 can be opened, and the shunt switch S4 can be closed. Because the bias switch S3 and the shunt switch S4 are not directly along the path of the second RF signal (RFin2), they contribute little or no noise to the second RF signal.

In FIG. 9, the adder circuit 146 is shown to include a BJT Q3 in a common base configuration for the BJT Q1 of the first current converter 142. The output from the collector of Q1 is shown to be provided to the emitter of Q3, and the output from Q3 is shown to be provided through its collector. The collector (of Q3) is shown to be coupled to a common node 136 where the processed signal from Q3 can combine with a processed signal from the other cascode amplification path. The base of Q3 is shown to be provided with a first bias voltage Vcas1.

The adder circuit 146 is shown to further include a BJT Q4 in a common base configuration for the BJT Q2 of the second current converter 144. The output from the collector of Q2 is shown to be provided to the emitter of Q4, and the output from Q4 is shown to be provided through its collector. The collector (of Q4) is shown to be coupled to the common node 136 where the processed signal from Q4 can combine with a processed signal from the other cascode amplification path. The common node 136 is shown to be coupled to the output node 138 so as to yield the output RF signal (RFout). The base of Q4 is shown to be provided with a second bias voltage Vcas2.

Other variations at different levels can also be implemented. For example, one or more features of the present disclosure can be implemented in architectures involving LNA and/or other amplification applications. In another example, various examples are described in the context of cascode configurations; however, it will be understood that other types of amplification configurations (such as a push-pull configuration) can be utilized. In yet another example, various examples are described in the context of BJTs; however, it will be understood that other types of transistors (such as a field-effect transistors (FETs)) can be utilized.

Table 1 lists various performance parameters obtained from simulation of the LNA circuit of FIG. 7 configured to support example cellular bands B30 (2.350 to 2.360 GHz for RX) and B38 (2.570 to 2.620 GHz for RX). The simulation was performed at a frequency of approximately 2.355 GHz for the B30 band, and approximately 2.6 GHz for the B38 band.

TABLE 1

| Mode | Gain (dB) | NF (dB) | S11 (dB) | S22 (dB) | Current (mA) |
| --- | --- | --- | --- | --- | --- |
| B30 (non-CA) | 16.8 | 2.44 | −12 | −15.2 | 3.7 |
| B38 (non-CA) | 16.5 | 2.13 | −11.7 | −23 | 3.7 |
| B30 (CA) | 16.1 | 3.02 | −15 | −17.2 | 6.3 |
| B38 (CA) | 14.2 | 2.9 | −10.5 | −50 | 6.3 |

In Table 1, Gain is the overall gain provided by the corresponding RF band path; NF is the noise figure measured at the output of the LNA circuit (and including diplexer loss and noise from all matching components); S11 is representative of the input voltage reflection coefficient; S22 is representative of the output voltage reflection coefficient; and Current is the total current associated with the corresponding RF band path. One can see that in the CA mode, performance of the B30 and B38 bands are degraded relatively little.

Figure 10:
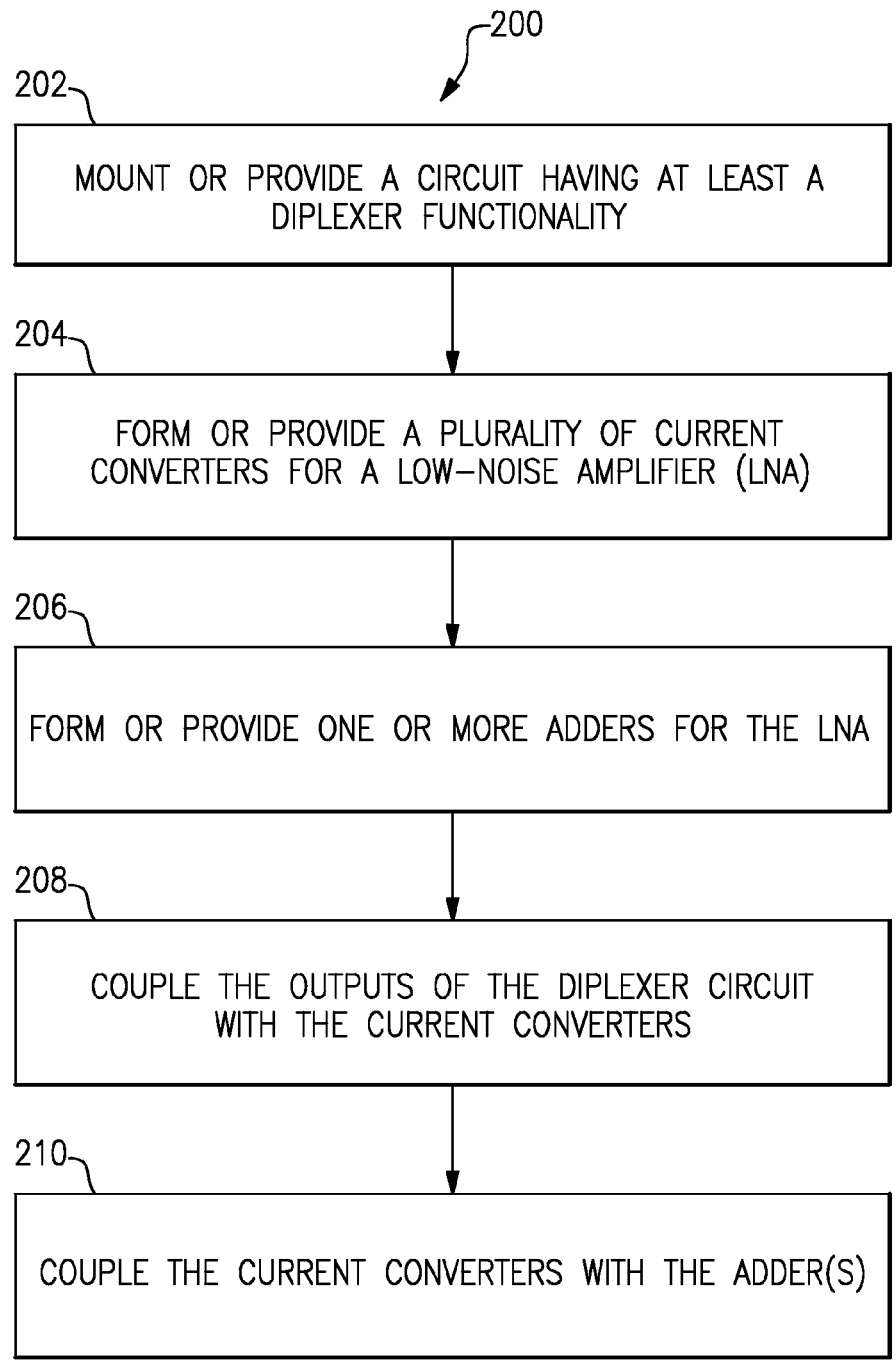
FIG. 10 shows a process that can be implemented to fabricate a device having one or more features as described herein.

FIG. 10 shows a process 200 that can be implemented to fabricate a device having one or more features as described herein. In block 202, a circuit having at least a diplexer functionality can be mounted or provided on a substrate. In various examples, carrier aggregation (CA) is described in the context of diplexers; however, it will be understood that CA can also be implemented with more than two bands (e.g., utilizing multiplexers). In some embodiments, a diplexer can be implemented as a device; and such a device can be mounted on the substrate.

In block 204, a plurality of current converters for a low-noise amplifier (LNA) can be formed or provided. In block 206, one or more adders for the LNA can be formed or provided. In block 208, the outputs of the diplexer circuit can be coupled with the current converters. In block 210, the current converters can be coupled with the one or more adders.

Figure 11:
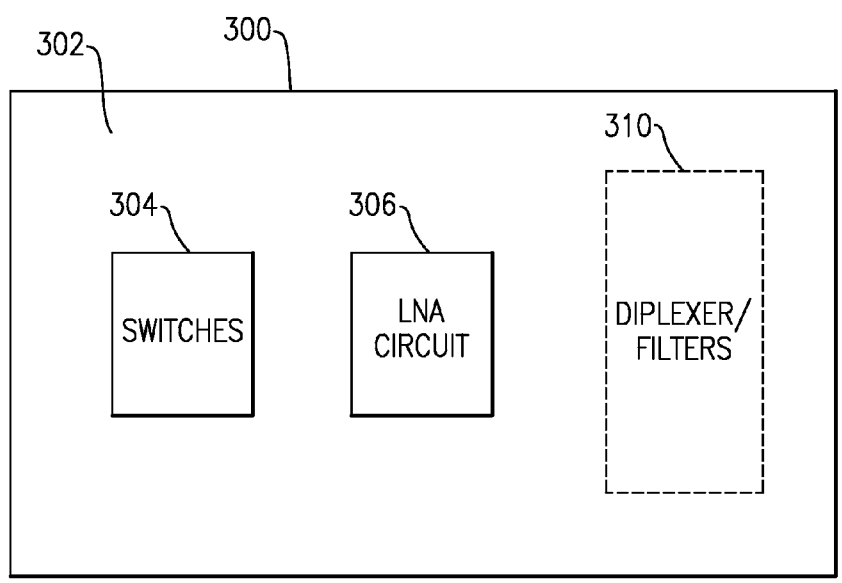
FIG. 11 shows that in some embodiments, one or more features as described herein can be implemented a module configured for RF applications.

In some embodiments, the device described in FIG. 10 and having one or more features as described herein can be a module configured for RF applications. FIG. 11 shows a block diagram of an RF module 300 (e.g., a front-end module) having a packaging substrate 302 such as a laminate substrate. Such a module can include one or more LNA circuits; and in some embodiments, such LNA circuit(s) can be implemented on a semiconductor die 306. An LNA circuit implemented on such a die can be configured to facilitate CA operation as described herein. Such an LNA circuit can also provide one or more advantageous features associated with improved carrier aggregation (CA) functionalities as described herein.

The module 300 can further include a plurality of switches implemented on one or more semiconductor die 304. In some embodiments, such switches are not implemented along RF signal paths between diplexer(s) and the LNA circuit, thereby yielding, for example, improved noise figure performance.

The module 300 can further include one or more diplexers and/or a plurality of filters (collectively indicated as 310) configured to process RF signals. Such diplexers/filters can be implemented as surface-mount devices (SMDs), as part of an integrated circuit (IC), of some combination thereof. Such diplexers/filters can include or be based on, for example, SAW filters, and can be configured as high Q devices.

In some implementations, an architecture, device and/or circuit having one or more features described herein can be included in an RF device such as a wireless device. Such an architecture, device and/or circuit can be implemented directly in the wireless device, in one or more modular forms as described herein, or in some combination thereof. In some embodiments, such a wireless device can include, for example, a cellular phone, a smart-phone, a hand-held wireless device with or without phone functionality, a wireless tablet, a wireless router, a wireless access point, a wireless base station, etc. Although described in the context of wireless devices, it will be understood that one or more features of the present disclosure can also be implemented in other RF systems such as base stations.

Figure 12:
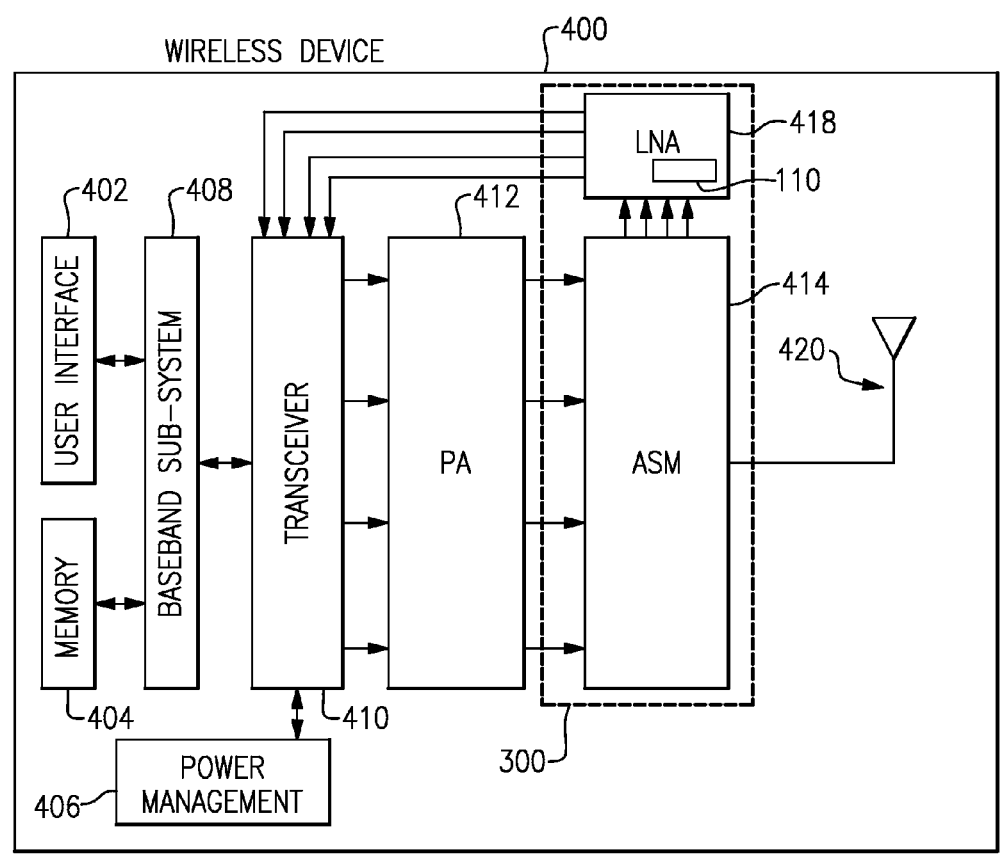
FIG. 12 shows an example wireless device having one or more advantageous features described herein.

FIG. 12 schematically depicts an example wireless device 400 having one or more advantageous features described herein. In some embodiments, such advantageous features can be implemented in a front-end (FE) module 300 as described herein. In some embodiments, such an FEM can include more or less components than as indicated by the dashed box.

Power amplifiers (PAs) in a PA module 412 can receive their respective RF signals from a transceiver 410 that can be configured and operated to generate RF signals to be amplified and transmitted, and to process received signals. The transceiver 410 is shown to interact with a baseband sub-system 408 that is configured to provide conversion between data and/or voice signals suitable for a user and RF signals suitable for the transceiver 410. The transceiver 410 is also shown to be connected to a power management component 406 that is configured to manage power for the operation of the wireless device 400. Such power management can also control operations of the baseband sub-system 408 and other components of the wireless device 400.

The baseband sub-system 408 is shown to be connected to a user interface 402 to facilitate various input and output of voice and/or data provided to and received from the user. The baseband sub-system 408 can also be connected to a memory 404 that is configured to store data and/or instructions to facilitate the operation of the wireless device, and/or to provide storage of information for the user.

In the example wireless device 400, the front-end module 300 can include one or more carrier aggregation-capable signal paths configured to provide one or more functionalities as described herein. Such signal paths can be in communication with an antenna switch module (ASM) 414 through their respective diplexer(s). In some embodiments, at least some of the signals received through an antenna 420 can be routed from the ASM 414 to one or more low-noise amplifiers (LNAs) 418 in manners as described herein. Amplified signals from the LNAs 418 are shown to be routed to the transceiver 410. In some embodiments, at least some of the LNAs 418 can include an LNA circuit 110 having one or more features as described herein.

Figure 13:
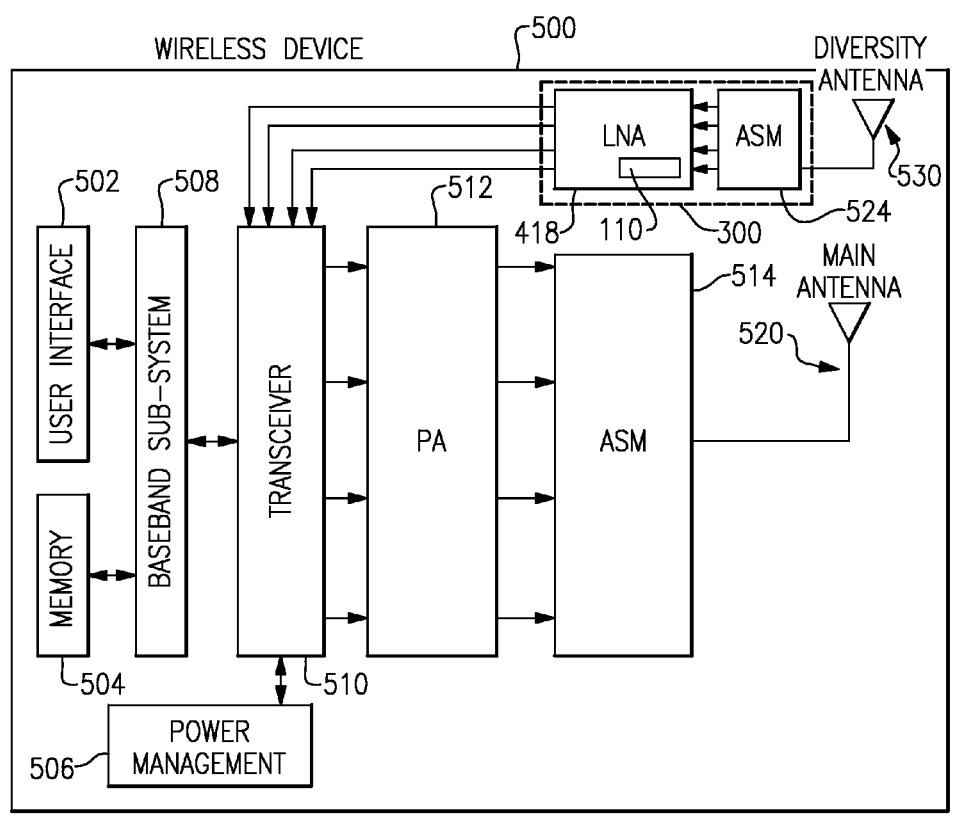
FIG. 13 shows another example wireless device having one or more advantageous features described herein.

FIG. 13 schematically depicts an example wireless device 500 having one or more advantageous features described herein. In some embodiments, such advantageous features can be implemented in a front-end (FE) module 300 as described herein. In some embodiments, such an FEM can include more or less components than as indicated by the dashed box.

PAs in a PA module 512 can receive their respective RF signals from a transceiver 510 that can be configured and operated to generate RF signals to be amplified and transmitted, and to process received signals. The transceiver 510 is shown to interact with a baseband sub-system 508 that is configured to provide conversion between data and/or voice signals suitable for a user and RF signals suitable for the transceiver 510. The transceiver 510 is also shown to be connected to a power management component 506 that is configured to manage power for the operation of the wireless device 500. Such power management can also control operations of the baseband sub-system 508 and other components of the wireless device 500.

The baseband sub-system 508 is shown to be connected to a user interface 502 to facilitate various input and output of voice and/or data provided to and received from the user. The baseband sub-system 508 can also be connected to a memory 504 that is configured to store data and/or instructions to facilitate the operation of the wireless device, and/or to provide storage of information for the user.

In the example wireless device 500, the front-end module 300 can include one or more carrier aggregation-capable signal paths configured to provide one or more functionalities as described herein. Such signal paths can be in communication with an antenna switch module (ASM) 524 through their respective diplexer(s). In some embodiments, at least some of the signals received through a diversity antenna 530 can be routed from the ASM 524 to one or more low-noise amplifiers (LNAs) 418 in manners as described herein. Amplified signals from the LNAs 418 are shown to be routed to the transceiver 510.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Examples Related to Diversity Receive (DRx) Implementation:

Using one or more main antennas and one or more diversity antennas in a wireless device can improve quality of signal reception. For example, a diversity antenna can provide additional sampling of RF signals in the vicinity of the wireless device. Additionally, a wireless device's transceiver can be configured to process the signals received by the main and diversity antennas to obtain a receive signal of higher energy and/or improved fidelity, when compared to a configuration using only the main antenna.

To reduce the correlation between signals received by the main and diversity antennas and/or to enhance antenna isolation, the main and diversity antennas can be separated by a relatively large physical distance in the wireless device. For example, the diversity antenna can be positioned near the top of the wireless device and the main antenna can be positioned near the bottom of the wireless device, or vice-versa.

The wireless device can transmit or receive signals using the main antenna by routing corresponding signals from or to the transceiver through an antenna switch module. To meet or exceed design specifications, the transceiver, the antenna switch module, and/or the main antenna can be in relatively close physical proximity to one another in the wireless device. Configuring the wireless device in this manner can provide relatively small signal loss, low noise, and/or high isolation.

In the foregoing example, the main antenna being physically close to the antenna switch module can result in the diversity antenna being positioned relatively far from the antenna switch module. In such a configuration, a relatively long signal path between the diversity antenna and the antenna switch module can result in significant loss and/or addition of loss associated with the signal received through the diversity antenna. Accordingly, processing of the signal received through the diversity antenna, including implementation of one or more features as described herein, in the close proximity to the diversity antenna can be advantageous.

Figure 14:
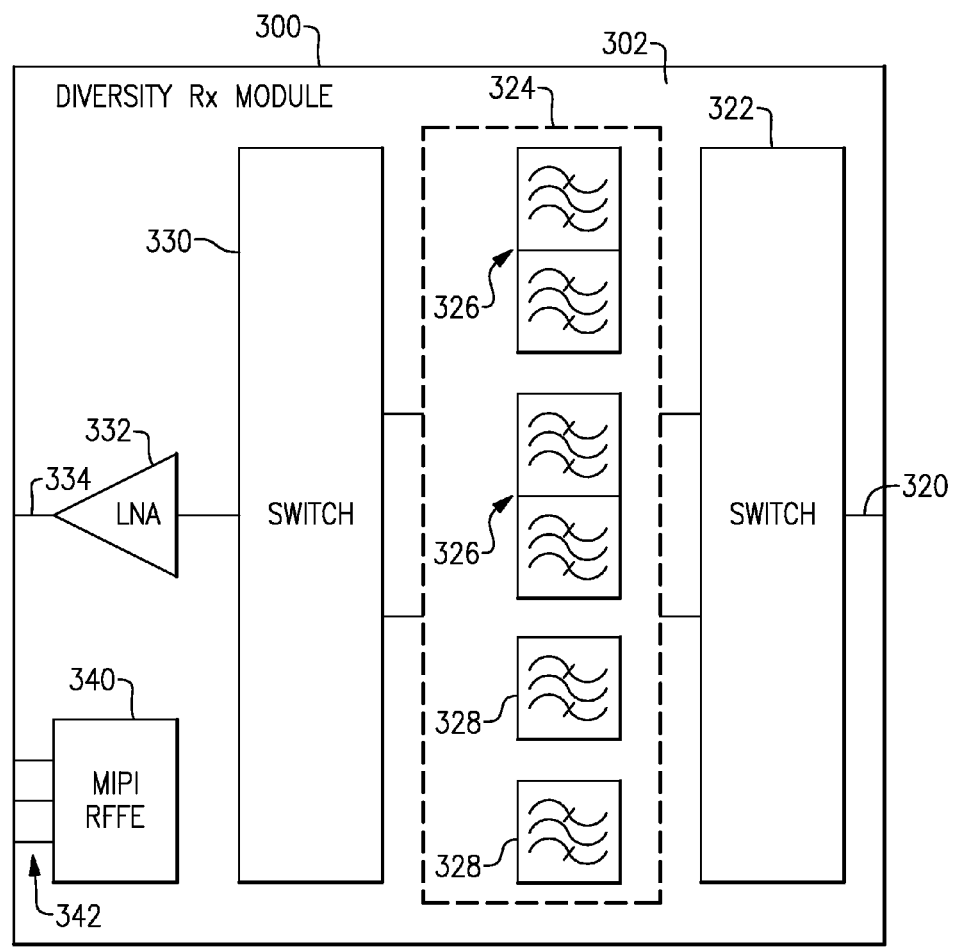
FIG. 14 shows that one or more features of the present disclosure can be implemented in a diversity receive module.

FIG. 14 shows that in some embodiments, one or more features of the present disclosure can be implemented in a diversity receive (DRx) module 300. Such a module can include a packaging substrate 302 (e.g., a laminate substrate) configured to receive a plurality of components, as well to provide or facilitate electrical connections associated with such components.

In the example of FIG. 14, the DRx module 300 can be configured to receive an RF signal from a diversity antenna (not shown in FIG. 14) at an input 320 and route such an RF signal to a low-noise amplifier (LNA) 332. It will be understood that such routing of the RF signal can involve carrier-aggregation (CA) and/or non-CA configurations. It will also be understood that although one LNA (e.g., a broadband LNA) is shown, there may be more than one LNAs in the DRx module 300. Depending on the type of LNA and the mode of operation (e.g., CA or non-CA), an output 334 of the LNA 332 can include one or more frequency components associated with one or more frequency bands.

In some embodiments, some or all of the foregoing routing of the RF signal between the input 320 and the LNA 332 can be facilitated by an assembly of one or more switches 322 between the input 320 and an assembly of diplexer(s) and/or filter(s) (collectively indicated as 324), and an assembly of one or more switches 330 between the diplexer/filter assembly 324 and the LNA 332. In some embodiments, the switch assemblies 322, 330 can be implemented on, for example, one or more silicon-on-insulator (SOI) die. In some embodiments, some or all of the foregoing routing of the RF signal between the input 320 and the LNA 332 can be achieved without some or all of the switches associated with the switch-assemblies 322, 330.

In the example of FIG. 14, the diplexer/filter assembly 324 is depicted as including two example diplexers 326 and two individual filters 328. It will be understood that the DRx module 300 can have more or less numbers of diplexers, and more or less numbers of individual filters. Such diplexer(s)/filter(s) can be implemented as, for example, surface-mount devices (SMDs), as part of an integrated circuit (IC), of some combination thereof. Such diplexers/filters can include or be based on, for example, SAW filters, and can be configured as high Q devices.

In some embodiments, the DRx module 300 can include a control component such as a MIPI RFFE interface 340 configured to provide and/or facilitate control functionalities associated with some or all of the switch assemblies 322, 330 and the LNA 332. Such a control interface can be configured to operate with one or more I/O signals 342.

Figure 15:
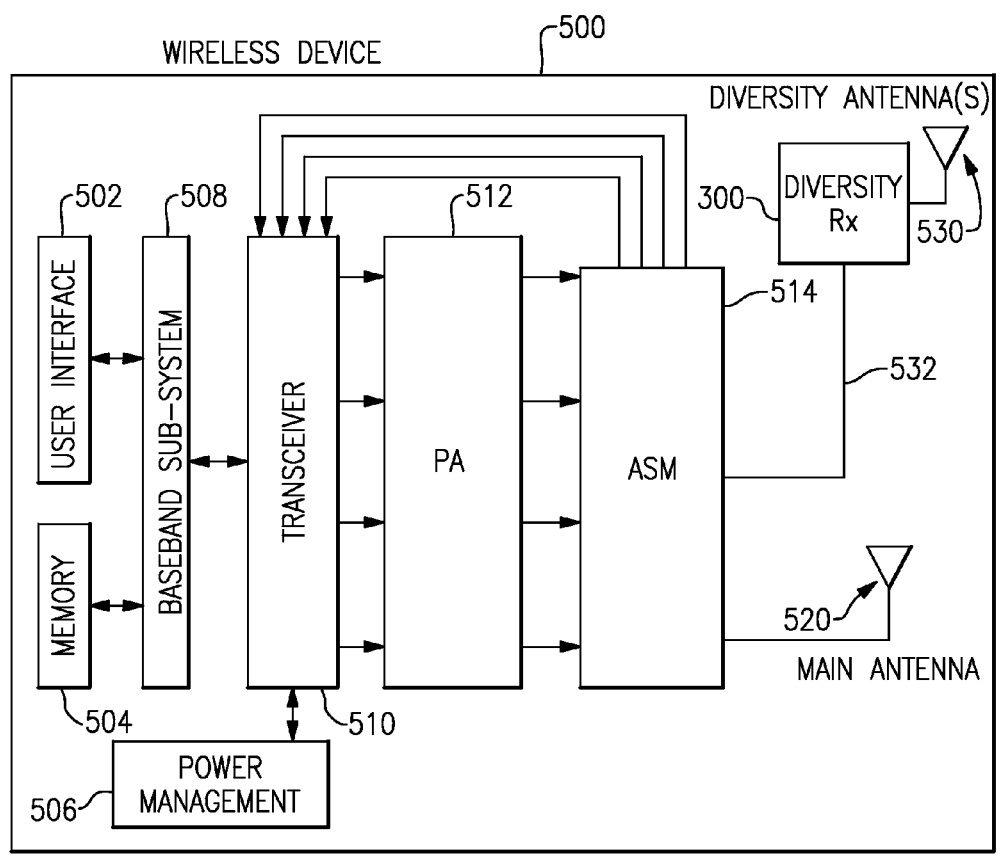
FIG. 15 shows an example wireless device having the diversity receive module of FIG. 14.

FIG. 15 shows that in some embodiments, a DRx module 300 having one or more features as described herein (e.g., DRx module 300 of FIG. 14) can be included in an RF device such as a wireless device 500. In such a wireless device, components such as user interface 502, memory 504, power management 506, baseband sub-system 508, transceiver 510, power amplifier (PA) 512, antenna switch module (ASM) 514, and antenna 520 can be generally similar to the examples of FIGS. 12 and 13.

In some embodiments, the DRx module 300 can be implemented between one or more diversity antennas and the ASM 514. Such a configuration can allow an RF signal received through the diversity antenna 530 to be processed (in some embodiments, including amplification by an LNA) with little or no loss of and/or little or no addition of noise to the RF signal from the diversity antenna 530. Such processed signal from the DRx module 300 can then be routed to the ASM through one or more signal paths 532 which can be relatively lossy.

In the example of FIG. 15, the RF signal from the DRx module 300 can be routed through the ASM 514 to the transceiver 510 through one or more receive (Rx) paths. Some or all of such Rx paths can include their respective LNA(s). In some embodiments, the RF signal from the DRx module 300 may or may not be further amplified with such LNA(s).

One or more features of the present disclosure can be implemented with various cellular frequency bands as described herein. Examples of such bands are listed in Table 2. It will be understood that at least some of the bands can be divided into sub-bands. It will also be understood that one or more features of the present disclosure can be implemented with frequency ranges that do not have designations such as the examples of Table 2.

TABLE 2

| Band | Mode | Tx Frequency Range (MHz) | Rx Frequency Range (MHz) |
|---|---|---|---|
| B1 | FDD | 1,920-1,980 | 2,110-2,170 |
| B2 | FDD | 1,850-1,910 | 1,930-1,990 |
| B3 | FDD | 1,710-1,785 | 1,805-1,880 |
| B4 | FDD | 1,710-1,755 | 2,110-2,155 |
| B5 | FDD | 824-849 | 869-894 |
| B6 | FDD | 830-840 | 875-885 |
| B7 | FDD | 2,500-2,570 | 2,620-2,690 |
| B8 | FDD | 880-915 | 925-960 |
| B9 | FDD | 1,749.9-1,784.9 | 1,844.9-1,879.9 |
| B10 | FDD | 1,710-1,770 | 2,110-2,170 |
| B11 | FDD | 1,427.9-1,447.9 | 1,475.9-1,495.9 |
| B12 | FDD | 699-716 | 729-746 |
| B13 | FDD | 777-787 | 746-756 |
| B14 | FDD | 788-798 | 758-768 |
| B15 | FDD | 1,900-1,920 | 2,600-2,620 |
| B16 | FDD | 2,010-2,025 | 2,585-2,600 |
| B17 | FDD | 704-716 | 734-746 |
| B18 | FDD | 815-830 | 860-875 |
| B19 | FDD | 830-845 | 875-890 |
| B20 | FDD | 832-862 | 791-821 |
| B21 | FDD | 1,447.9-1,462.9 | 1,495.9-1,510.9 |
| B22 | FDD | 3,410-3,490 | 3,510-3,590 |
| B23 | FDD | 2,000-2,020 | 2,180-2,200 |
| B24 | FDD | 1,626.5-1,660.5 | 1,525-1,559 |
| B25 | FDD | 1,850-1,915 | 1,930-1,995 |
| B26 | FDD | 814-849 | 859-894 |
| B27 | FDD | 807-824 | 852-869 |
| B28 | FDD | 703-748 | 758-803 |
| B29 | FDD | N/A | 716-728 |
| B30 | FDD | 2,305-2,315 | 2,350-2,360 |
| B31 | FDD | 452.5-457.5 | 462.5-467.5 |
| B33 | TDD | 1,900-1,920 | 1,900-1,920 |
| B34 | TDD | 2,010-2,025 | 2,010-2,025 |
| B35 | TDD | 1,850-1,910 | 1,850-1,910 |
| B36 | TDD | 1,930-1,990 | 1,930-1,990 |
| B37 | TDD | 1,910-1,930 | 1,910-1,930 |
| B38 | TDD | 2,570-2,620 | 2,570-2,620 |
| B39 | TDD | 1,880-1,920 | 1,880-1,920 |
| B40 | TDD | 2,300-2,400 | 2,300-2,400 |
| B41 | TDD | 2,496-2,690 | 2,496-2,690 |
| B42 | TDD | 3,400-3,600 | 3,400-3,600 |
| B43 | TDD | 3,600-3,800 | 3,600-3,800 |
| B44 | TDD | 703-803 | 703-803 |

For the purpose of description, it will be understood that "multiplexer," "multiplexing" and the like can include "diplexer," "diplexing" and the like.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A carrier aggregation (CA) circuit comprising
an input node, a common node, and an output node;
a first filter configured to allow operation in a first frequency band;
a second filter configured to allow operation in a second frequency band;
a first amplification path implemented between the input node and the output node, and including the first filter, a first current converter stage implemented as a bipolar junction transistor configured to receive a signal through its base and generate an output through its collector, the common node, and a common adder stage implemented as a shared bipolar junction transistor, the first amplification path free of switches; and
a second amplification path implemented between the input node and the output node, and including the second filter, a second current converter stage implemented as a bipolar junction transistor configured to receive a signal through its base and generate an output through its collector, the common node, and the common adder stage, the second amplification path free of switches, the shared bipolar junction transistor configured to receive the signals output from the bipolar junction transistors of the first and second current converter stages through its emitter and generate an output through its collector, the first and second current converter stages and the common adder stage being parts of a low-noise amplifier.

2. The carrier aggregation circuit of claim 1 wherein the first amplification path and the second amplification path being free of switches allows the carrier aggregation circuit to operate with a reduced noise figure.

3. The carrier aggregation circuit of claim 1 further comprising a bias circuit coupled to the bipolar junction transistors of the first and second current converter stages, and including a switchable bias supply path between a respective bias node and the respective base, the switchable bias supply path configured to be capable of being turned on or off to activate or deactivate the respective bipolar junction transistor.

4. The carrier aggregation circuit of claim 3 wherein the bias circuit further includes a switchable shunt path configured to provide a shunt path when the respective bipolar junction transistor is deactivated.

5. The carrier aggregation circuit of claim 1 wherein the bipolar junction transistor of each of the first and second current converter stages includes an emitter coupled to ground through an inductance.

6. The carrier aggregation circuit of claim 1 wherein the shared bipolar junction transistor is configured to receive a cascode bias voltage through its base.

7. The carrier aggregation circuit of claim 1 wherein each of the first amplification path and the second amplification path is capable of being in an active state or an inactive state to allow the carrier aggregation circuit to operate in a carrier aggregation mode or a non-carrier aggregation mode without separate switches along the first amplification path and the second amplification path.

8. The carrier aggregation circuit of claim 7 wherein the active state or the inactive state for each of the first amplification path and the second amplification path is achieved by activating or deactivating the respective current converter stage.

9. A radio-frequency module comprising:
a packaging substrate configured to receive a plurality of components; and
a carrier aggregation circuit implemented on the packaging substrate, and including an input node, a common node, and an output node, the carrier aggregation circuit further including a first filter configured to allow operation in a first frequency band and a second filter configured to allow operation in a second frequency band, the carrier aggregation circuit further including a first amplification path implemented between the input node and the output node, and including the first filter, a first current converter stage implemented as a bipolar junction transistor configured to receive a signal through its base and generate an output through its collector, the common node, and a common adder stage implemented as a shared bipolar junction transistor, the first amplification path free of switches, the carrier aggregation circuit further including a second amplification path implemented between the input node and the output node, and including the second filter, a second current converter stage implemented as a bipolar junction transistor configured to receive a signal through its base and generate an output through its collector, the common node, and the common adder stage, the second amplification path free of switches, the shared bipolar junction transistor configured to receive the signals output from the bipolar junction transistors of the first and second current converter stages through its emitter and generate an output through its collector, the first and second current converter stages and the common adder stage being parts of a low-noise amplifier.

10. The radio-frequency module of claim 9 wherein each of the first filter and the second filter includes a surface acoustic wave filter.

11. The radio-frequency module of claim 10 wherein the radio-frequency module is a diversity receive module.

12. A wireless device comprising:
a receiver configured to process radio-frequency signals;
module in communication with the receiver, and including a carrier aggregation circuit configured to route the radio-frequency signals, the carrier aggregation circuit including an input node, a common node, and an output node; a first filter configured to allow operation in a first frequency band and a second filter configured to allow operation in a second frequency band; a first amplification path implemented between the input node and the output node, and including the first filter, a first current converter stage implemented as a bipolar junction transistor configured to receive a signal through its base and generate an output through its collector, the common node, and a common adder stage implemented as a shared bipolar junction transistor, the first amplification path free of switches; and a second amplification path implemented between the input node and the output node, and including the second filter, a second current converter stage implemented as a bipolar junction transistor configured to receive a signal through its base and generate an output through its collector, the common node, and the common adder stage, the second amplification path free of switches, the shared bipolar junction transistor configured to receive the signals output from the bipolar junction transistors of the first and second current converter stages through its emitter and generate an output through its collector, the first and second current converter stages and the common adder stage being parts of a low-noise amplifier; and
an antenna in communication with the radio-frequency module, and configured to receive the radio-frequency signals.

13. The wireless device of claim 12 wherein the antenna includes a diversity antenna, and the module includes a diversity receive module.

14. The wireless device of claim 13 further comprising an antenna switch module configured to route the radio-frequency signals from the diversity antenna to the receiver, such that the diversity receive module is implemented between the diversity antenna and the antenna switch module.

* * * * *